US006606254B2

United States Patent
Yoneda (10) Patent No.: US 6,606,254 B2
(45) Date of Patent: Aug. 12, 2003

(54) COOLING MODULE GROUNDING STRUCTURE AND METHOD AND ELECTRONIC APPARATUS WITH THE STRUCTURE

(75) Inventor: Kiyokazu Yoneda, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/080,588

(22) Filed: Feb. 25, 2002

(65) Prior Publication Data

US 2002/0118527 A1 Aug. 29, 2002

(30) Foreign Application Priority Data

Feb. 28, 2001 (JP) .......................... 2001-053685

(51) Int. Cl.[7] .............................. H05K 7/14; H05K 7/18
(52) U.S. Cl. ........................ 361/799; 361/683; 361/687
(58) Field of Search ................................ 361/796, 799, 361/801, 810, 683, 687, 690, 695

(56) References Cited

U.S. PATENT DOCUMENTS

| | | | | |
|---|---|---|---|---|
| 5,079,438 A | * | 1/1992 | Heung | ......................... 307/141 |
| 5,338,214 A | * | 8/1994 | Steffes et al. | ................ 361/683 |
| 5,956,227 A | * | 9/1999 | Kitaoka | .................. 165/104.34 |
| 5,991,164 A | * | 11/1999 | Saito et al. | .................... 174/51 |
| 6,072,696 A | * | 6/2000 | Horii | ........................... 361/695 |
| 6,101,088 A | * | 8/2000 | Nakajima et al. | ........ 312/223.2 |
| 6,101,089 A | * | 8/2000 | Seto et al. | ................... 361/683 |
| 6,151,214 A | * | 11/2000 | Yeh | ............................ 361/695 |
| 6,219,323 B1 | * | 4/2001 | Fukatsu et al. | ................ 174/51 |
| 6,366,463 B2 | * | 4/2002 | Hamano | .................... 165/80.4 |

* cited by examiner

Primary Examiner—David Martin
Assistant Examiner—Thanh S. Phan
(74) Attorney, Agent, or Firm—Finnegan, Henderson, Farabow, Garrett & Dunner, L.L.P.

(57) ABSTRACT

An electronic component is mounted on a printed circuit board, and a metal cooling module for cooling the electronic component is opposed to the electronic component. A vertical support mechanism supports the cooling module such that the cooling module is kept in pressure contact with the electronic component, the pressure being exerted perpendicular to the surface of the printed circuit board and falling within a predetermined range. The cooling module is grounded via an elastic member having electrical conductivity.

9 Claims, 7 Drawing Sheets

COOLING MODULE GROUNDING STRUCTURE AND METHOD AND ELECTRONIC APPARATUS WITH THE STRUCTURE

CROSS-REFERENCE TO RELATED APPLICATIONS

This application is based upon and claims the benefit of priority from prior Japanese Patent Application No. 2001-053685, filed Feb. 28, 2001, the entire contents of which are incorporated by reference.

BACKGROUND OF THE INVENTION

1. Field of the Invention

The present invention relates to a grounding structure and method for a metal cooling module which cools heat-generating components mounted on a printed circuit board in an electronic apparatus, and an electronic apparatus provided with the grounding structure.

2. Description of the Related Art

An electronic apparatus, such as a personal computer, incorporates a number of electronic components that consume a great amount of power and generate heat while operating, such as a CPU, peripheral controllers and a display controller, and the like, the components being formed of integrated circuits (IC). Therefore, such an electronic apparatus is equipped with a cooling module for dissipating heat generated by the electronic components. As a cooling module, a metal module made of, for example, aluminum is generally used in view of its high cooling efficiency and low cost.

Further, in an electronic apparatus that employs a mounting method such as the BGA (Ball Grid Array), a recent mainstream mounting method, the range of pressure that can be applied to the device is predetermined. Accordingly, when arranging a cooling module for heat radiation in contact with, for example, a CPU, it is difficult to adjust the pressure simply by screwing the module into the printed circuit board with the CPU interposed between the board and the module. Because of this, in general, a spring, for example, is additionally used to adjust the pressure vertically applied to the CPU by the cooling module.

Furthermore, it is necessary to secure the cooling module to the printed circuit board with a pressure falling within a predetermined range applied to the board. If the pressure is low, the cooling module may vibrate due to the magnetic field created by the current that flows when the CPU is operating. As a result, the cooling module cannot be grounded securely, which makes it electrically unstable.

Also, in accordance with increases in the operating speeds of electronic components such as CPUs, the power consumption of such electronic components has increased markedly. Accordingly, the cooling module corresponding to each electronic component has been enlarged. Under these circumstances, when a CPU is operating, considerable vibration occurs, particularly, at an end portion of the cooling module. Moreover, electromagnetic radiation from the CPU is picked up by the cooling module, with the result that extra noise is generated by the cooling module, adversely affecting peripheral electronic apparatuses.

To avoid the above problems, for example, conductive elastic members such as gaskets are held between opposite ends of the cooling module and printed circuit board, and are connected to ground planes on the board, thereby providing secondary suppression of vertical vibration of the cooling module while grounding the module.

However, it is necessary to prevent the secondary-fixing/grounding means from increasing the pressure applied to the CPU. Because of this, the secondary-fixing/grounding means cannot be brought into contact with the cooling module with a sufficient force, and therefore radiated noise cannot be adequately suppressed.

BRIEF SUMMARY OF THE INVENTION

The present invention has been developed under the above-described circumstances, and its object is to provide a cooling module grounding structure and method and an electronic apparatus with the grounding structure, which can maintain a cooling module at ground potential in a stable manner, and reduce the amount of noise generated by an electronic component during its operation.

To satisfy the object, according to an aspect of the invention, there is provided a grounding structure for a cooling module, comprising: a printed circuit board installed in an electronic apparatus; an electronic component mounted on the printed circuit board; a metal cooling module opposed to the electronic component to cool the electronic component; a vertical support mechanism which supports the cooling module such that the cooling module is kept in pressure contact with the electronic component, the pressure being exerted perpendicular to the surface of the printed circuit board and falling within a predetermined range; and a ground portion electrically grounding the cooling module.

According to another aspect of the invention, there is provided an electronic apparatus comprising: an apparatus body; a printed circuit board installed in the apparatus body and provided with an electronic component; a metal cooling module installed in the apparatus body and opposed to the electronic component, the metal cooling module being configured to cool the electronic component; a vertical support mechanism which supports the cooling module such that the cooling module is kept in pressure contact with the electronic component, the pressure being exerted perpendicular to the surface of the printed circuit board and falling within a predetermined range; and a ground portion electrically connected to the cooling module to ground it.

According to yet another aspect of the invention, there is provided a method of grounding a cooling module, comprising: mounting an electronic component on a printed circuit board; securing a metal cooling module, configured to cool the electronic component, to the printed circuit board by a force exerted perpendicular to the printed circuit board such that the cooling module is kept in pressure contact with the electronic component, the pressure falling within a predetermined range; and pressing and fixing the cooling module by a force exerted parallel to the printed circuit board, thereby connecting the cooling module to a ground area on the printed circuit board to ground the cooling module.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Portable personal computers according to embodiments of the invention will be described with reference to the accompanying drawings.

Figure 1:
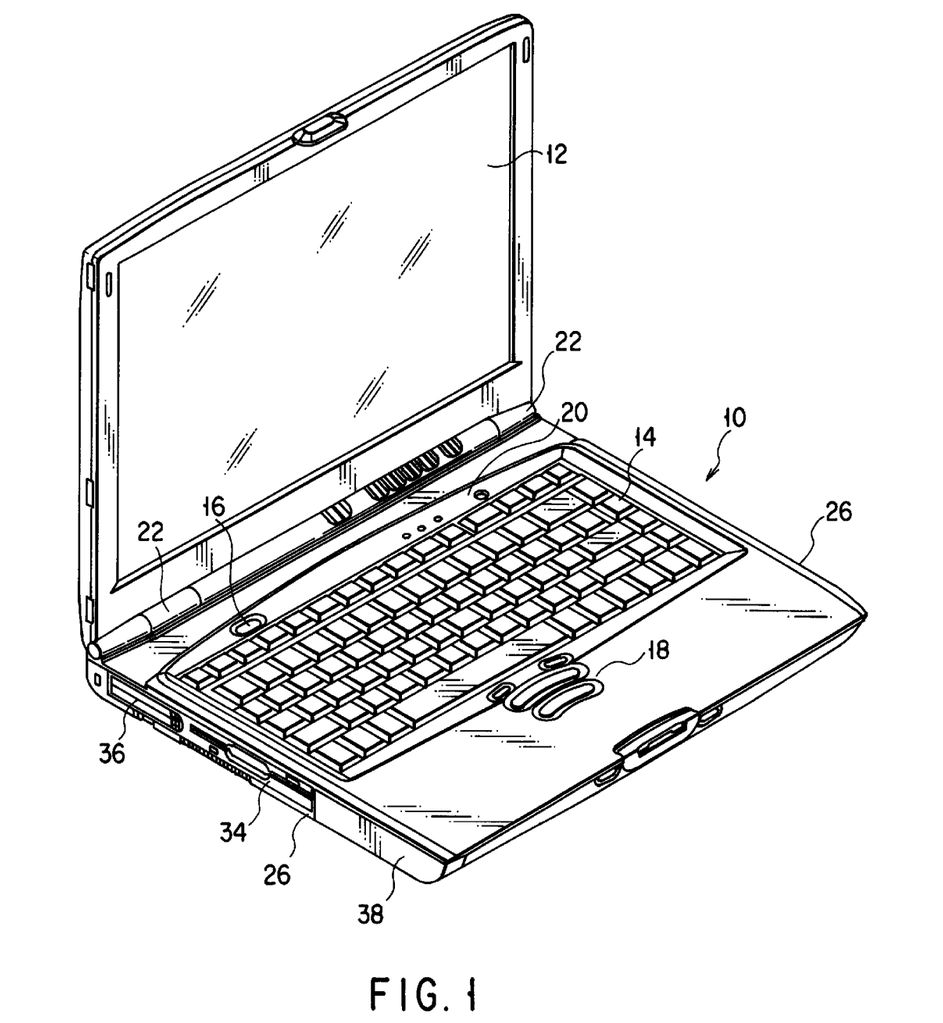
FIG. 1 is a perspective view illustrating a personal computer according to a first embodiment of the invention.
Figure 2:
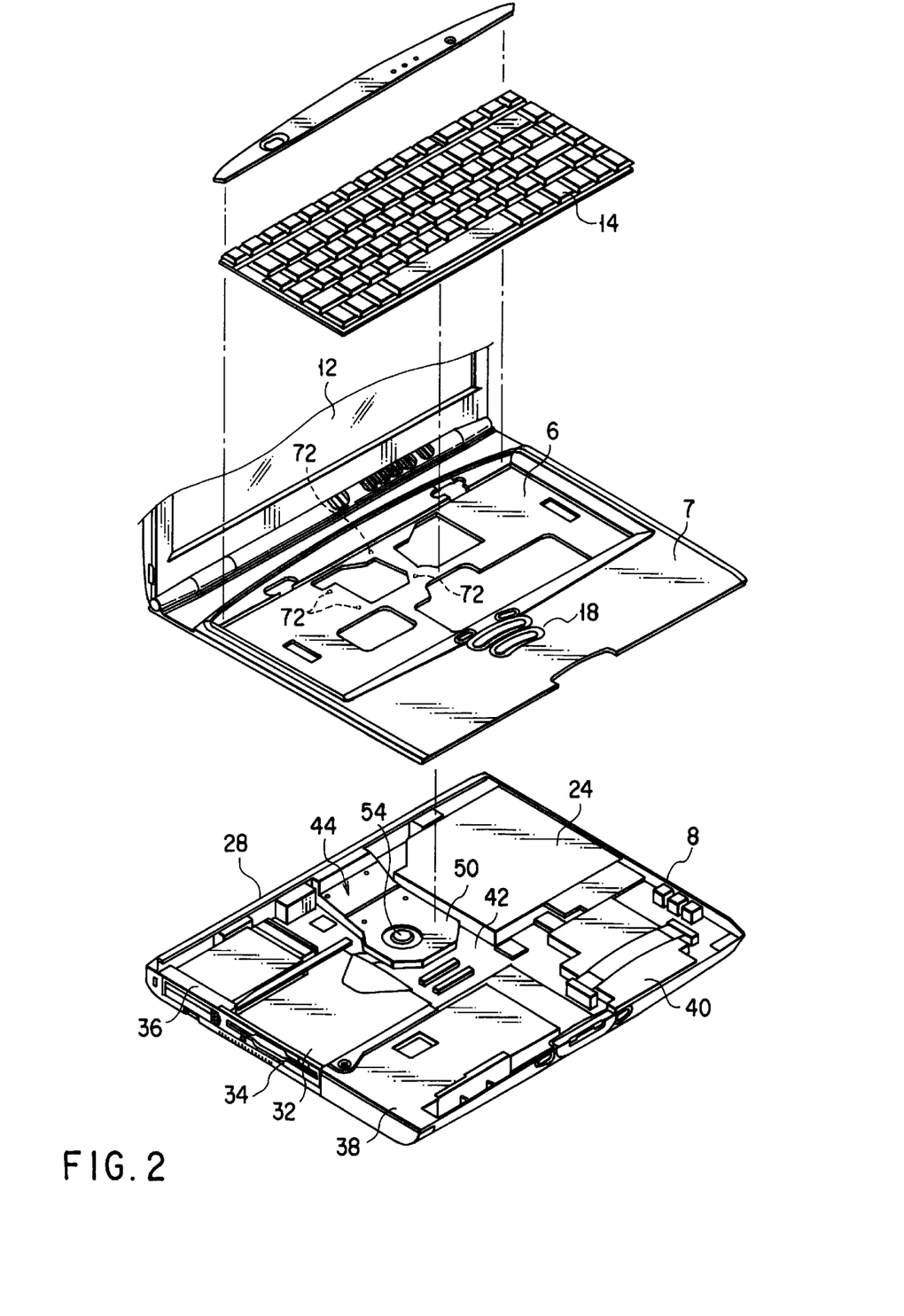
FIG. 2 is an exploded perspective view illustrating the personal computer.

As shown in FIGS. 1 and 2, a personal computer comprises an apparatus body 10 in the form of a flat rectangular box and a flat rectangular display unit 12.

The apparatus body 10 includes a rectangular base portion 8 having a top opening and a cover 7 fitted to the base portion so as to cover the top opening of the base portion. The apparatus body 10 includes a top wall formed of the cover 7, a pair of sidewalls 26, a rear wall 28, and a rectangular bottom wall 25.

The top wall of the apparatus body 10 is formed with a rectangular recess 6, which contains a keyboard 14 having a large number of keys 5. Further, items such as a power switch 16, click switches 18 and indicators 20 are arranged on the top wall of the apparatus body 10. The display unit 12 is supported by means of hinge portions 22 on the rear part of the apparatus body 10 for a rocking motion between an open position (shown in FIG. 1), in which the keyboard 14 can be operated and a closed position in which the display unit 12 covers the keyboard.

Arranged in the apparatus body 10, moreover, are an optical disk drive 24, floppy disk drive 32, card loading portion 36, battery pack 38, and various other electronic components. A printed circuit board 42, which is mounted with electronic components, is located on the bottom wall 25 in the apparatus body 10, and a cooling module 44 for cooling the interior of the apparatus body 10 and the electronic components is located on the circuit board 42.

Figure 3:
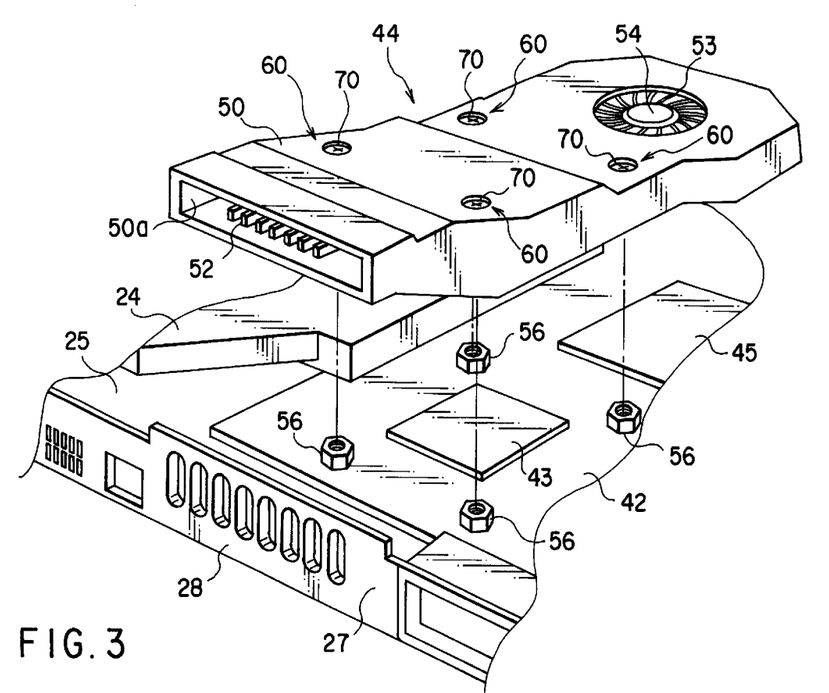
FIG. 3 is an exploded perspective view illustrating a cooling module section incorporated in the personal computer.
Figure 4:
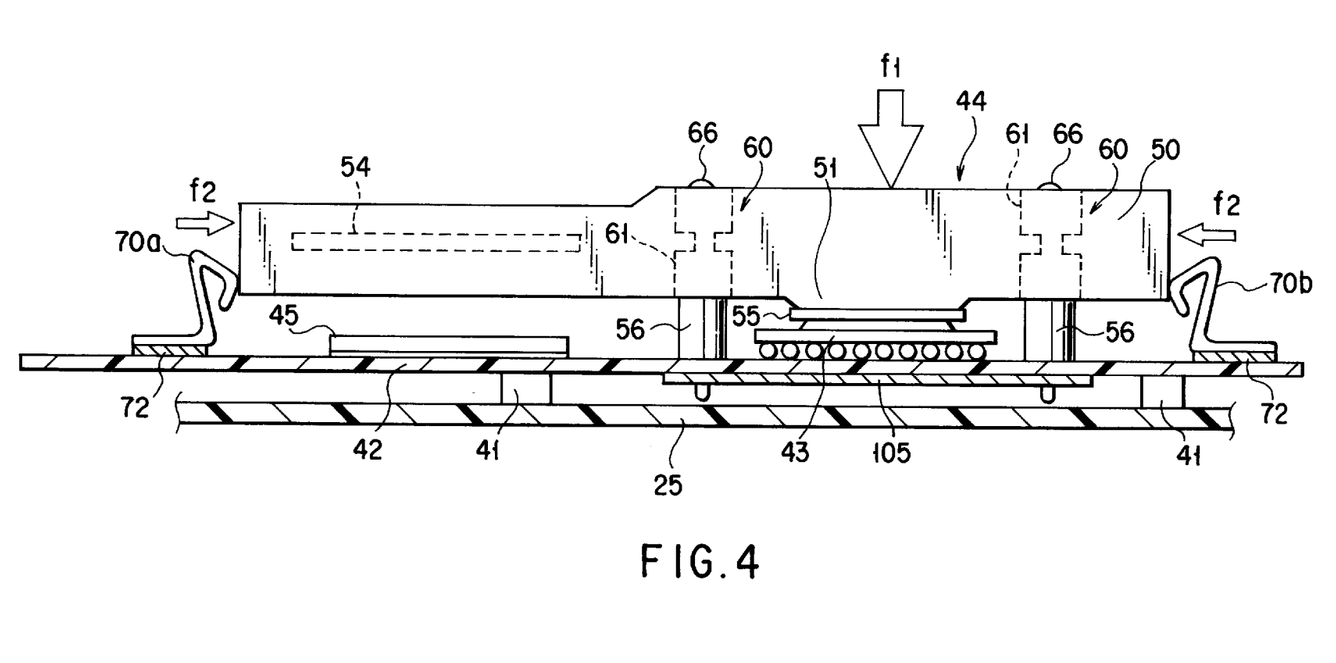
FIG. 4 is a sectional view illustrating a grounding structure for the cooling module.

As shown in FIGS. 2 to 4, the cooling module 44 includes a cooling duct 50 of aluminum or some other metal having a rectangular cross section and a fan 54 in the cooling duct. The cooling duct 50 is supported on the printed circuit board 42 by means of a vertical support mechanism that includes four support post portions 60, and is situated under the keyboard 14. A discharge port 50a formed in one end of the cooling duct 50 communicates with discharge holes 28 formed in the rear wall 27 of the apparatus body 10. The fan 54 is located in the other end portion of the cooling duct 50 and opposed to a circular suction port 53 in the duct 50. A large number of radiator fins 52 are formed in the cooling duct 50.

The printed circuit board 42 is located on bosses 41 formed on the inner surface of the bottom wall 25 of the apparatus body 10. Mounted on the printed circuit board 42, moreover, are a BGA-mount CPU 43, a semiconductor package 45, and many other electronic components (not shown).

The cooling duct 50 is placed on the CPU 43 and the semiconductor package 45. The duct 50 has a partially projecting contact portion 51 that is in contact with the CPU 43 through a cooling sheet 55. The cooling sheet 55 interposed between the contact portion 51 and CPU 43 is formed of a material having a high heat conductivity and adhesiveness, which facilitates the transmission of the heat generated by the CPU 43 to the cooling duct 50.

The four support post portions 60, which each have a floating structure, are arranged around the CPU 43. Thus, the cooling duct 50 is supported by means of the support post portions 60 in such a manner that the contact portion 51 is elastically pressed against the CPU 43.

Figure 5:
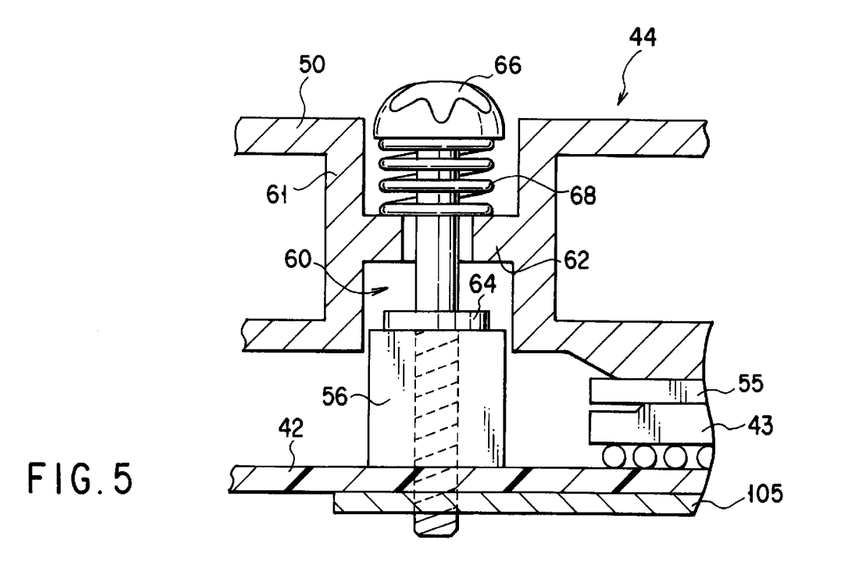
FIG. 5 is a sectional view illustrating a support section of the cooling module.

As shown in FIGS. 3 to 5, each support post portion 60 is provided with a hexagonal stud 56, stopper 64, fixing screw 66, and compression coil spring 68. The hexagonal stud 56 is screwed into the printed circuit board 42 and projects upward from the circuit board 42. The stopper 64 is formed integrally with the screw 66. The fixing screw 66 is screwed into the screw hole of the stud 56. The spring 68 is located around the fixing screw 66. The support post portions 60 stand perpendicular to the printed circuit board 42.

The cooling duct 50 includes four partition sleeves 61. Each sleeve 61 defines a through hole which is divided from the inside the duct and penetrates the duct 50 at right angles thereto. The four support post portions 60 are inserted individually into the sleeves 61 of the duct 50. An annular spring seat 62 is formed on the inner surface of each sleeve 61, and the compression coil spring 68 is arranged around the screw 66 and interposed between the spring seat 62 and the fixing screw 66.

Thus, the cooling duct 50 is elastically supported by means of the four support post portions 60 and pressed against the CPU 43 by means of the compression coil springs 68. The pressure applied to the CPU 43 can be made to fall within a predetermined range by adjusting the tightness of each fixing screw 66. The stopper 64 prevents each fixing screw 66 from being over-tightened, thereby preventing a pressure exceeding the predetermined range from being applied to the CPU 43.

A reinforcing plate 105 is screwed onto the lower surface of the printed circuit board 42 at a position corresponding to the CPU 43 to prevent the printed circuit board 42 from bending when pressure is applied to the CPU 43. Further, it is desirable that the support post portions 60 are located as near the CPU 43 as possible.

In the above-described structure, the cooling module 44 is secured to the printed circuit board 42 by a force exerted in a direction substantially perpendicular to the surface of the board 42, so that the module touches the CPU 43 with a pressure falling within the predetermined range applied to the CPU 43. Also, in the embodiment, the cooling module 44 is secured to the circuit board 42 by a force exerted in a direction parallel to the surface of the board, and is grounded at the same time.

Figure 6:
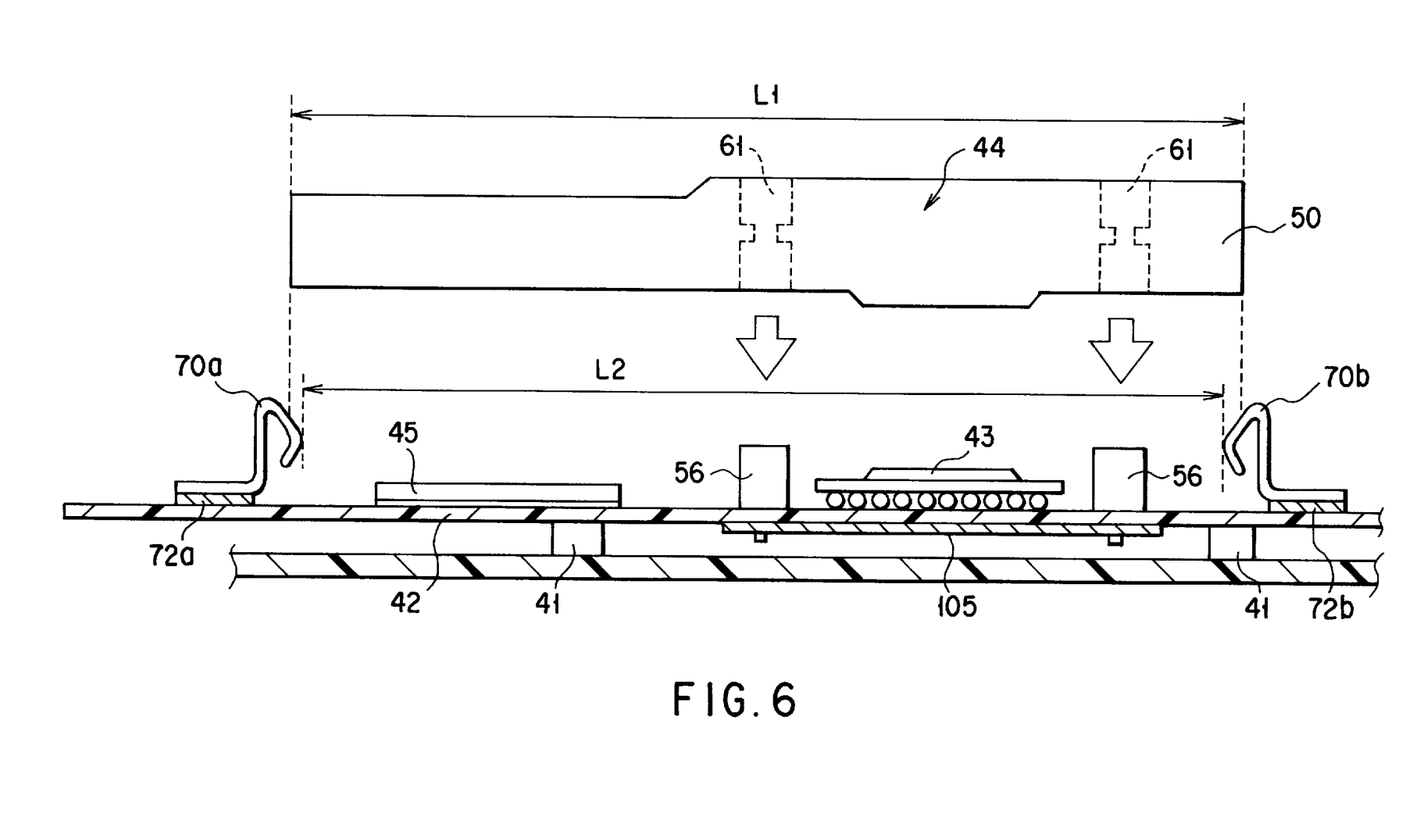
FIG. 6 is a sectional view illustrating the cooling module and its grounding structure before mounting the former on the latter.

More specifically, as shown in FIGS. 4 and 6, a pair of conductive metal springs 70a and 70b having the same spring modulus are provided on the printed circuit board 42. The metal springs 70a and 70b are fixed, by soldering or screw clamping, to respective ground terminals 72 on the circuit board 42, and hence are maintained at ground potential.

Further, supposing that the length of the cooling duct 50 in a direction parallel to the surface of the printed circuit board 42 is L1, the distance L2 between the pair of metal springs 70a and 70b is set to be slightly less than L1 (L2<L1).

In a state in which the cooling module 44 is supported on the printed circuit board 42 by the support post portions 60 in a floating manner, the pressure applied perpendicularly by the cooling module 44 to the CPU 43 is adjusted to fall within a predetermined range. In other words, the module 44 is secured to the board 42 such that a vertical pressure f1 is applied to the surface of the board 42. When the cooling module 44 is mounted on the printed circuit board 42, the opposite ends of the cooling duct 50 are in contact with the metal springs 70a and 70b, thereby elastically deforming the metal springs in an outward direction. As a result, each of the metal springs 70a and 70b is displaced by half the difference between L1 and L2, thereby applying to the cooling module 44 an elastic force f2 that is exerted parallel to the surface of the printed circuit board 42. Thus, the metal springs 70a and 70b secondarily support the cooling module 44 on the board. In this state, the metal springs 70a and 70b also ground the metal cooling module 44 via the ground terminals 72. The pair of metal springs 70a and 70b provide a parallel support mechanism.

In a personal computer with the above-described cooling module grounding structure, the cooling module 44 is secured to the printed circuit board 42 by a force exerted in a direction perpendicular to the printed circuit board 42, and also by a secondary force exerted in a direction parallel to the surface of the board 42 without applying further pressure to the CPU 43. At the same time, the cooling module 44 is grounded via the metal springs 70a and 70b.

This structure can suppress vibration of the cooling module 44, more reliably maintain the module at ground potential, and reduce the mechanical and electrical noise generated by the module 44 while the CPU 43 is operating. At the same time, noise external to the personal computer can be prevented from reaching the CPU 43 via the cooling module 44, thereby enhancing the operational stability of the CPU 43. This enables the cooling module itself to have a large size.

In addition, since both secondary fixing and grounding of the cooling module 44 to the printed circuit board 42 can be achieved, the ground potential of the cooling module can be stabilized, and the cooling module can be easily assembled when constructing a personal computer.

Figure 7:
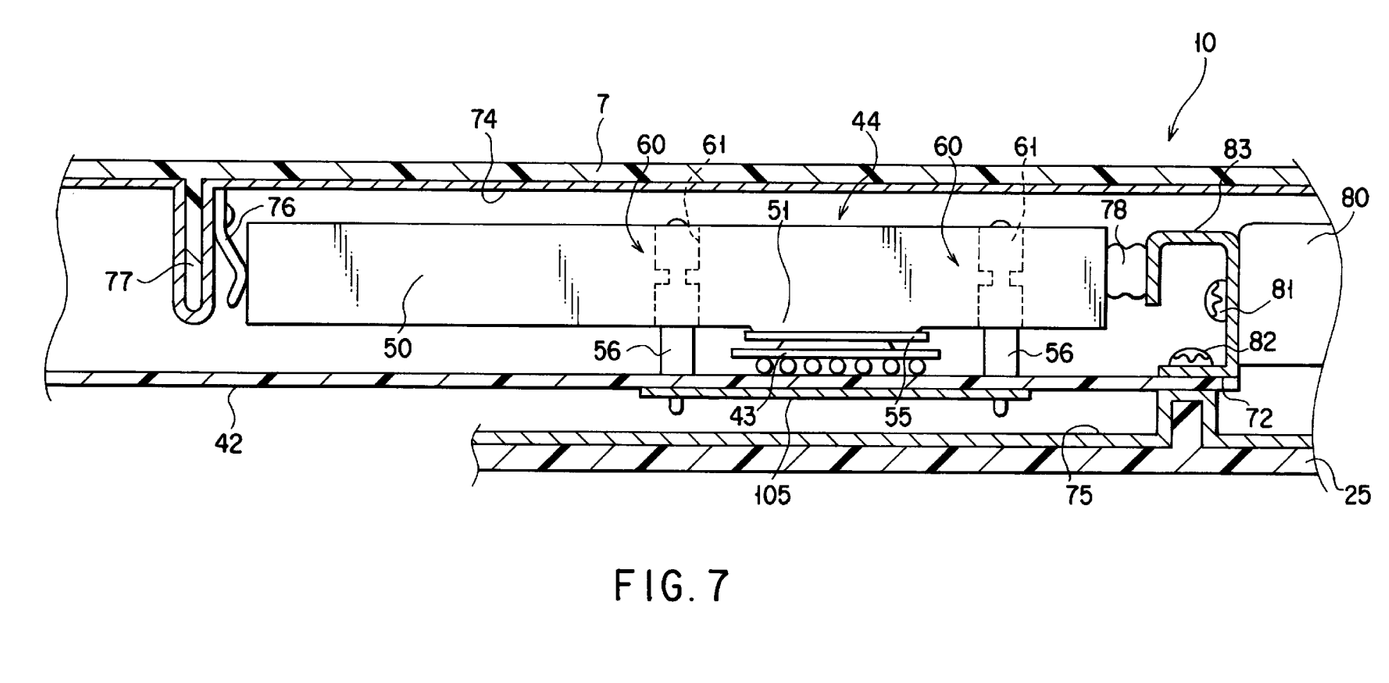
FIG. 7 is a sectional view illustrating a grounding structure for a cooling module according to a second embodiment of the invention.

A second embodiment of the invention will now be described. As shown in FIG. 7, a cooling module 44 employed in an electronic apparatus, such as a personal computer, according to the second embodiment is secured to a printed circuit board 42, using a substantially vertical force, by support post portions 60 similar to those in the above-described first embodiment, and is kept in contact with a CPU 43 on the printed circuit board by a pressure falling within a predetermined range.

In this embodiment, elastic members having electrical conductivity are attached to the housing of a personal computer, i.e., the cover 7, the bottom wall 25, or the side walls. These elastic members are used to exert, upon the cooling module 44, forces parallel to the surface of the printed circuit board 42, thereby securing the cooling module 44 to the board 42 and grounding it. The cover 7 and bottom wall 25, made of plastic, have their inner surfaces plated with a conductive material, and form frame grounds 74 and 75 for grounding.

A conductive metal spring 76 and gasket 78 are used as conductive elastic members. The gasket 78 is formed of urethane sponge coated with a conductive fiber of, for example, Ni. Even if the elastic members are thus formed of different materials, it is desirable that they have the same elastic modulus.

The metal spring 76 is secured to a projection 77 on the inner surface of the cover 7 by spot welding or screw clamping, and is grounded via the frame ground 74. The projection 77 is provided for permitting the metal spring 76 to displace by a predetermined amount when the cooling module 44 is mounted. When the module 44 is mounted, the metal spring 76 is in contact with one end of the cooling module 44, and presses the module by a rightward (in FIG. 7) force parallel to the surface of the printed circuit board 42.

The apparatus body 10 contains a drive unit 80, such as a floppy disk drive or a DVD-ROM, covered with a metal chassis. The drive unit 80 is secured to a metal bracket 83 by screws 81. The bracket 83 is secured to the bottom wall 25 of the apparatus body 10 by screws 82, with the ground 72 and the printed circuit board 42 interposed therebetween, and is kept at ground potential.

The gasket 78 is attached to the bracket 83 and grounded via the ground 72 of the circuit board 42 and the frame ground 75. Furthermore, the bracket 83 is arranged so that it is brought into contact with the other end of the cooling module 44 and deforms by a predetermined amount when the cooling module 44 is mounted in a predetermined position. When the cooling module is mounted, the gasket 78 presses the module by a leftward (in FIG. 7) force parallel to the surface of the printed circuit board 42.

Thus, the cooling module 44 is pressed by both the metal spring 76 and gasket 78 along the surface of the printed circuit board 42, whereby the module is fixed and grounded. The metal spring 76 and gasket 78 form a parallel support mechanism. The other structures are similar to those employed in the first embodiment. Therefore, corresponding reference numerals are attached to the elements of the second embodiment similar to those of the first embodiment, and the detailed description thereof will be omitted.

In the second embodiment constructed as above, the cooling module 44 is secured to the printed circuit board 42 by the support post portions 60, using a predetermined pressure exerted perpendicular to the board. Further, the cooling module 44 is elastically held between the metal spring 76 and gasket 78 along the surface of the printed circuit board 42 and is also grounded, without applying a further pressure to the CPU 43. Accordingly, the cooling module 44 can be suppressed in vibration and hence be maintained at ground potential in a stable manner. As a result, the noise generated by the cooling module 44 during the operation of the CPU 43 can be reduced, thereby also reducing any adverse affections of the noise upon peripheral electronic apparatus. Moreover, even if it is difficult to attach elastic members to the printed circuit board for some reason, the cooling module 44 can be fixed by a force exerted parallel to the board and also be grounded.

Figure 8:
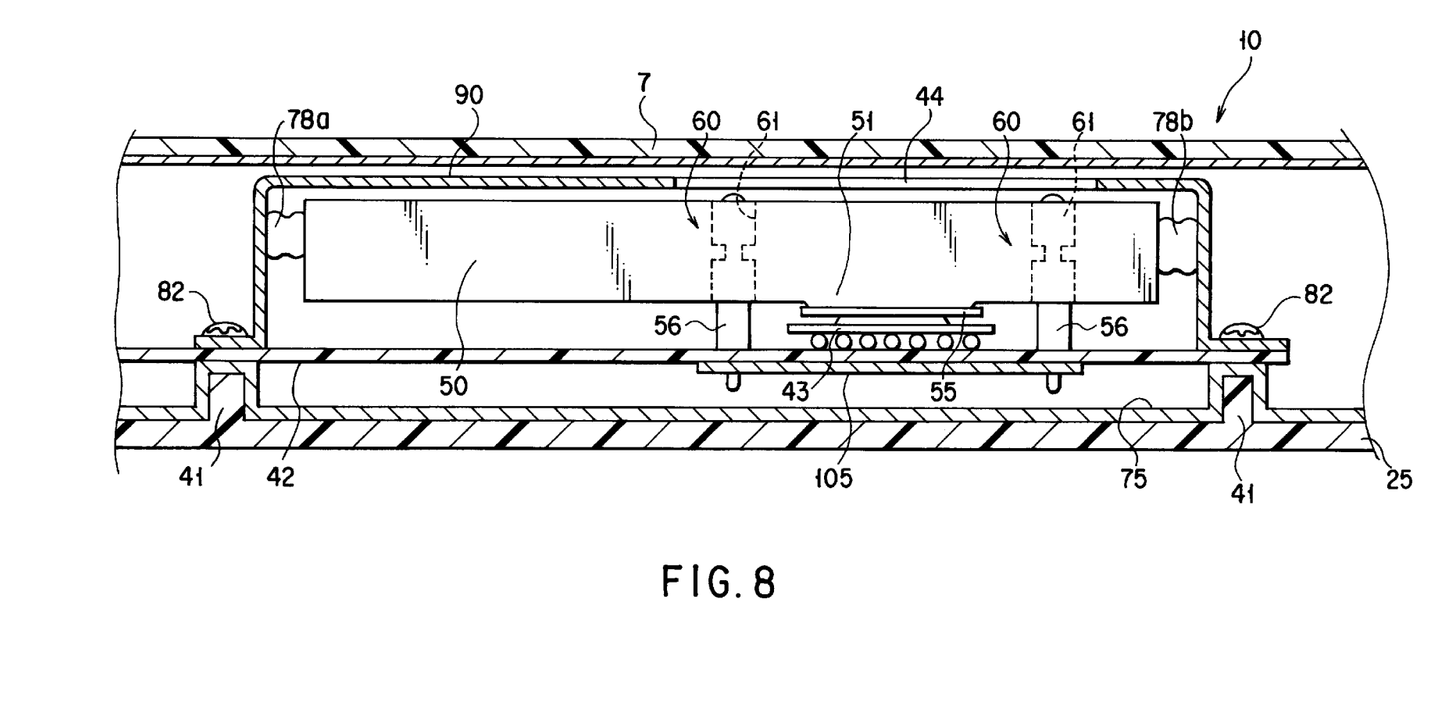
FIG. 8 is a sectional view illustrating a grounding structure for a cooling module according to a third embodiment of the invention.

A description will be given to a third embodiment of the invention. As shown in FIG. 8, a cooling module 44 employed in an electronic apparatus, such as a personal computer, according to the second embodiment is secured to a printed circuit board 42, using a substantially vertical force, by support post portions 60 similar to those in the above-described first embodiment, and is kept in contact with a CPU 43 on the printed circuit board by a pressure falling within a predetermined range.

In this embodiment, elastic members having electrical conductivity are attached to the housing of a personal computer, thereby fixing the cooling module 44 by a force exerted parallel to the surface of the printed circuit board 42, and grounding it.

More specifically, the plastic cover 7 and bottom wall 25, which form the apparatus body 10, have their inner surfaces plated with a conductive material, and form frame grounds 74 and 75 for grounding. A metal bracket 90 is provided on the printed circuit board 42 to surround the cooling module 44, and is screwed into the boss 41 of the bottom wall 25 by a plurality of screws 82 with the grounds 72 and board 42 interposed therebetween. As a result, the bracket 90 is electrically connected to the grounds 72 of the board 42 and the frame ground 75, and hence is kept at ground potential.

Conductive gaskets 78a and 78b are provided as conductive elastic members between the bracket 90 and the opposite ends of the cooling module 44. The conductive gaskets 78a and 78b are formed of urethane sponge coated with a conductive fiber of, for example, Ni. These gaskets provide a parallel support mechanism.

Further, the bracket 90 is arranged such that when the cooling module 44 is mounted in a predetermined position, the conductive gaskets 78a and 78b are kept in contact with the opposite ends of the cooling module 44 and elastically deformed by a predetermined amount. Thus, the gaskets 78a and 78b hold the cooling module 44 therebetween by pressing it in opposite directions along the surface of the printed circuit board 42. In this state, the cooling module 44 is electrically connected to the bracket 90 via the gaskets 78a and 78b and is grounded via the bracket 90 and printed circuit board 42.

The other structures are similar to those employed in the first embodiment. Therefore, corresponding reference numerals are attached to the elements of the second embodiment similar to those of the first embodiment, and no detailed description will be given of them.

In the third embodiment constructed as above, the cooling module 44 is secured to the printed circuit board by the support post portions 60, using a predetermined pressure exerted perpendicular to the board. Further, the cooling module 44 is elastically held between the gaskets 78a and 78b along the surface of the printed circuit board 42 and is also grounded, without applying a further pressure to the CPU 43. Accordingly, the vibration of the cooling module 44 can be suppressed, hence grounding can be more stably obtained. As a result, the noise generated by the cooling module 44 during the operation of the CPU 43 can be reduced, thereby also reducing any adverse affections of the noise upon peripheral electronic apparatuses.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, although in each of the above-described embodiments, the cooling module is secondarily fixed by forces exerted parallel to the printed circuit board in two opposite directions, and is also grounded, the module may be pressed by forces exerted parallel to the board in four directions. In other words, it is sufficient if the elastic members are arranged so that a plurality of forces applied to the cooling module will be offset, i.e., the sum of the vectors of the forces is zero. The type and/or elastic modulus of each elastic member does not matter. Further, the attachment places of the elastic members, e.g. the circuit board or housing, may be selected depending upon the situation.

Moreover, the grounding structure may be modified such that the cooling module is primarily grounded when it is secured by a force exerted perpendicular to the printed circuit board, and is also secondarily grounded by a force exerted parallel to the board. In addition, it is not always necessary to form the entire cooling module of a metal, and only a part of the module may be formed of a metal. It is sufficient if the cooling module can be electrically connected to the printed circuit board or apparatus body via conductive elastic members.

Also, it is not always necessary to provide the cooling module with a duct and fan. A metal heat sink provided only with fins, independent of a fan, for example, may be used as the cooling module.

What is claimed is:

1. A grounding structure for a module, comprising:
    a printed circuit board installed in an electronic apparatus and including a ground area provided on a surface thereof;
    an electronic component mounted on the surface of the printed circuit board;
    a metal cooling module opposed to the electronic component to cool the electronic component;
    a vertical support mechanism including an elastic member and supporting the cooling module such that the cooling module is elastically pressed against the electronic component by the elastic member in a direction perpendicular to a surface of the printed circuit board;
    a parallel support mechanism which supports the cooling module by applying, to the cooling module, a pressure exerted parallel to the surface of the printed circuit board; and
    a ground portion electrically grounding the cooling module;
    the parallel support mechanism including a pair of elastic members mounted on the printed circuit board and connected to the ground area, the elastic members being provided on opposite sides of the cooling module such that they are kept in elastic contact with the cooling module being interposed between the elastic members, the elastic members having electrical conductivity and forming the ground portion.

2. The grounding structure according to claim 1, wherein the pair of elastic members have a common elastic modulus.

3. The grounding structure according to claim 1, wherein the pair of elastic members are formed of respective metal springs.

4. An electronic apparatus comprising:
    an apparatus body;
    a printed circuit board installed in the apparatus body and including a ground area provided on the surface thereof, on which an electronic component is mounted;
    a metal cooling module installed in the apparatus body and opposed to the electronic component, the metal cooling module being configured to cool the electronic component;

a vertical support mechanism including an elastic member and supporting the cooling module such that the cooling module is elastically pressed against the electronic component by the elastic member in a direction perpendicular to a printed surface of the circuit board;

a parallel support mechanism which supports the cooling module by applying, to the cooling module, a pressure exerted parallel to the surface of the printed circuit board; and a ground portion electrically grounding the cooling module;

the parallel support mechanism including a pair of elastic members mounted on the printed circuit board and connected to the ground area, the elastic members being provided on opposite sides of the cooling module such that they are kept in elastic contact with the cooling module being interposed between the elastic members, the elastic members having electrical conductivity and forming the ground portion.

5. A grounding structure for a cooling module, comprising:

a printed circuit board installed in an electronic apparatus and including a ground area provided on the surface thereof;

an electronic component mounted on the surface of the printed circuit board;

a metal cooling module opposed to the electronic component to cool the electronic component;

a vertical support mechanism including an elastic member and supporting the cooling module such that the cooling module is elastically pressed against the electronic component by the elastic member in a direction perpendicular to a surface of the printed circuit board;

a parallel support mechanism which supports the cooling module by applying, to the cooling module, a pressure exerted parallel to the surface of the printed circuit board; and a ground portion electrically grounding the cooling module;

the parallel support mechanism including a metal bracket mounted on the printed circuit board and connected to the ground area, and an elastic member provided between the bracket and the cooling module and kept in elastic contact with the bracket and the cooling module, the elastic member having electrical conductivity and forming the ground portion.

6. An electronic apparatus comprising:

an apparatus body;

a printed circuit board installed in the apparatus body and including a ground area provided on the surface thereof, on which an electronic component is mounted;

a metal cooling module installed in the apparatus body and opposed to the electronic component, the metal cooling module being configured to cool the electronic component;

a vertical support mechanism including an elastic member and supporting the cooling module such that the cooling module is elastically pressed against the electronic component by the elastic member in a direction perpendicular to a surface of the printed circuit board;

a parallel support mechanism which supports the cooling module by applying, to the cooling module, a pressure exerted parallel to the surface of the printed circuit board; and a ground portion electrically grounding the cooling module;

the parallel support mechanism including a metal bracket mounted on the printed circuit board and connected to the ground area, and an elastic member provided between the bracket and the cooling module and kept in elastic contact with the bracket and the cooling module, the elastic member having electrical conductivity and forming the ground portion.

7. An electronic apparatus comprising:

an apparatus body having a frame ground formed on an inner surface thereof;

a printed circuit board installed in the apparatus body and provided with an electronic component;

a metal cooling module installed in the apparatus body and opposed to the electronic component, the metal cooling module being configured to cool the electronic component;

a vertical support mechanism including an elastic member and supporting the cooling module such that the cooling module is elastically pressed against the electronic component by the elastic member in a direction perpendicular to a surface of the printed circuit board;

a parallel support mechanism which supports the cooling module by applying, to the cooling module, a pressure exerted parallel to the surface of the printed circuit board; and a ground portion electrically grounding the cooling module;

the parallel support mechanism including a metal bracket attached to the apparatus body and connected to the frame ground, and an elastic member provided between the bracket and the cooling module and kept in elastic contact with the bracket and the cooling module, the elastic member having electrical conductivity and forming the ground portion.

8. An electronic apparatus comprising:

an apparatus body including a frame ground for grounding formed on an inner surface thereof;

a printed circuit board installed in the apparatus body and provided with an electronic component;

a metal cooling module installed in the apparatus body and opposed to the electronic component, the metal cooling module being configured to cool the electronic component;

a vertical support mechanism including an elastic member and supporting the cooling module such that the cooling module is elastically pressed against the electronic component by the elastic member in a direction perpendicular to a surface of the printed circuit board;

a parallel support mechanism which supports the cooling module by applying, to the cooling module, a pressure exerted parallel to the surface of the printed circuit board; and a ground portion electrically grounding the cooling module;

the parallel support mechanism includes a metal bracket attached to the apparatus body and connected to the frame ground, and a pair of elastic members provided between the bracket and the cooling module and kept in elastic contact with the bracket and the cooling module;

the elastic members being provided on opposite sides of the cooling module such that they are kept in elastic contact with the cooling module with the cooling module being interposed between the elastic members, the elastic members having electrical conductivity and forming the ground portion.

9. An electronic apparatus comprising:

an apparatus body including a frame ground for grounding formed on an inner surface thereof;

a printed circuit board installed in the apparatus body and including a ground area provided on the surface thereof, on which an electronic component is mounted;

a metal cooling module installed in the apparatus body and opposed to the electronic component, the metal cooling module being configured to cool the electronic component;

a vertical support mechanism including an elastic member and supporting the cooling module such that the cooling module is elastically pressed against the electronic component by the elastic member in a direction perpendicular to a surface of the printed circuit board;

a parallel support mechanism which supports the cooling module by applying, to the cooling module, a pressure exerted parallel to the surface of the printed circuit board; and a ground portion electrically grounding the cooling module;

the parallel support mechanism includes a pair of elastic members attached to the apparatus body and connected to the frame ground, the elastic members being provided on opposite sides of the cooling module such that they are kept in elastic contact with the cooling module with the cooling module being interposed between the elastic members, the elastic members having electrical conductivity and forming the ground portion.

* * * * *

UNITED STATES PATENT AND TRADEMARK OFFICE
CERTIFICATE OF CORRECTION

PATENT NO. : 6,606,254 B2
DATED : August 12, 2003
INVENTOR(S) : Yoneda

It is certified that error appears in the above-identified patent and that said Letters Patent is hereby corrected as shown below:

Column 8,
Line 26, change "structure for a module" to -- structure for a cooling module --.

Column 9,
Line 5, change "to a printed surface of the circuit board;" to a surface of the printed circuit board; --.

Signed and Sealed this

Twenty-third Day of March, 2004

JON W. DUDAS
*Acting Director of the United States Patent and Trademark Office*